United States Patent
Lou et al.

(10) Patent No.: US 8,217,398 B2
(45) Date of Patent: Jul. 10, 2012

(54) METHOD FOR THE FORMATION OF A GATE OXIDE ON A SIC SUBSTRATE AND SIC SUBSTRATES AND DEVICES PREPARED THEREBY

(75) Inventors: Victor Lienkong Lou, Schenectady, NY (US); Kevin Sean Matocha, Rexford, NY (US); Gregory Thomas Dunne, Rexford, NY (US)

(73) Assignee: General Electric Company, Niskayuna, NY (US)

( * ) Notice: Subject to any disclaimer, the term of this patent is extended or adjusted under 35 U.S.C. 154(b) by 865 days.

(21) Appl. No.: 12/251,866

(22) Filed: Oct. 15, 2008

(65) Prior Publication Data
US 2010/0090227 A1    Apr. 15, 2010

(51) Int. Cl.
*H01L 29/15* (2006.01)
*H01L 21/31* (2006.01)

(52) U.S. Cl. .......................................................... 257/77

(58) Field of Classification Search ............. 257/E21.17, 257/42, 51, 54, 77, 134, 319, 329, 421, E21.135, 257/E21.409, E29.259, E29.104, E29.297–E29.298; 438/510, 285, 197, 475, 513, 535, 289, 680, 438/753, 770, 931
See application file for complete search history.

(56) References Cited

U.S. PATENT DOCUMENTS

| | | | |
|---|---|---|---|
| 6,455,892 B1 | 9/2002 | Okuno et al. | |
| 6,956,238 B2 | 10/2005 | Ryu et al. | |
| 7,202,142 B2 | 4/2007 | Lee et al. | |
| 7,221,010 B2 | 5/2007 | Ryu | |
| 2002/0102358 A1 * | 8/2002 | Das et al. | 427/376.2 |
| 2002/0197780 A1 | 12/2002 | Lai et al. | |
| 2007/0243722 A1 | 10/2007 | Nakamura et al. | |

FOREIGN PATENT DOCUMENTS

| | | | |
|---|---|---|---|
| JP | 2001196579 A | | 7/2001 |
| JP | 2002270839 A | | 9/2002 |
| WO | WO0229874 | * | 4/2002 |
| WO | 2008/026181 A1 | | 3/2008 |

* cited by examiner

*Primary Examiner* — Dao H Nguyen
*Assistant Examiner* — Tram H Nguyen
(74) *Attorney, Agent, or Firm* — Scott J. Asmus

(57) ABSTRACT

Methods are provided for improving inversion layer mobility and providing low defect density in a semiconductor device based upon a silicon carbide (SiC) substrate. More specifically, embodiments of the present method provide for the formation of a gate oxide on a silicon carbide substrate comprising oxidizing the substrate with a gaseous mixture comprising oxygen at a temperature of at least about 1300° C. Semiconductor devices, such as MOSFETS, based upon a substrate treated according to the present method are expected to have inversion layer mobilities of at least about 12 $cm^2/Vs$.

20 Claims, 3 Drawing Sheets

METHOD FOR THE FORMATION OF A GATE OXIDE ON A SIC SUBSTRATE AND SIC SUBSTRATES AND DEVICES PREPARED THEREBY

BACKGROUND

Silicon (Si) is the most widely used semiconductor material, and has been for many years. Due to intense commercial interest and resulting research and development, silicon device technology has reached an advanced level, and in fact, many believe that silicon power deices are approaching the theoretical maximum power limit predicted for this material. Further refinements in this material are not likely to yield substantial improvements in performance, and as a result, development efforts have shifted in focus to the development of other wide bandgap semiconductors as replacements for silicon.

Silicon carbide (SiC) has many desirable properties for high voltage, high frequency and high temperature applications. More particularly, SiC has a large critical electric field (10 times higher than that of Si), a large bandgap (3 times that of Si), a large thermal conductivity (4 times that of Si) and a large electron saturation velocity (twice that of Si). These properties support the theory that SiC will excel over conventional power device applications, such as MOSFETs, SiC n-channel enhancement mode MOSFETs, etc.

Generally, in order to use silicon carbide substrates as the basis for semiconductor devices, such as MOSFETs, an oxide layer must be formed on the SiC substrate. Although theoretically, the oxide can be formed on either the C-face or the Si-face of the SiC crystal, epitaxial layers grown on the C-face are not commercially available and so, MOSFET devices on 0001-Si face 4H—SiC are most sought after.

The performance of these devices is predominantly affected by the on-resistance of the channel, for power devices around and below 2 KV. The channel on-resistance, in turn, is largely controlled by the electron mobility in the inversion layer. Unfortunately, SiC MOSFETs fabricated on the Si-face of a SiC substrate have shown poor inversion layer mobility, which typically results in large power dissipation and loss of efficiency.

The mobility, and furthermore the stability of the gate attributes over the expected life of the device, are largely controlled by the poor interface between the gate oxide and the silicon carbide substrate through which the current conduction occurs. Specifically, the interface between the gate oxide and the SiC substrate may typically have a large number of interface traps, or defects, which in various ways interact with electrons moving through the inversion channel.

It would thus be desirable to provide such devices with improved inversion layer mobility, as well as a lower density of defects at the gate oxide/SiC interface.

BRIEF DESCRIPTION

In a first aspect, there is provided a method for the formation of a gate oxide on a silicon carbide substrate. The method comprises exposing the substrate to an environment comprising oxygen and at a temperature of at least about 1300° C. so that an oxide layer is formed on the substrate.

In a second aspect, a semiconductor device produced by the inventive method is provided. In one particular embodiment of the invention, the semiconductor device comprises a MOSFET.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
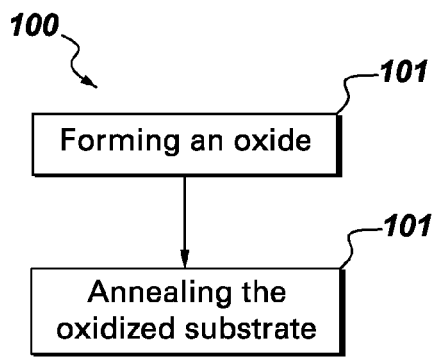
FIG. 1 is a flow-chart schematically illustrating one embodiment of the present method.

Unless defined otherwise, technical and scientific terms used herein have the same meaning as is commonly understood by one of skill in the art to which this invention belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced item, and the terms "front", "back", "bottom", and/or "top", unless otherwise noted, are merely used for convenience of description, and are not limited to any one position or spatial orientation. If ranges are disclosed, the endpoints of all ranges directed to the same component or property are inclusive and independently combinable (e.g., ranges of "up to about 25 wt. %, or, more specifically, about 5 wt. % to about 20 wt. %," is inclusive of the endpoints and all intermediate values of the ranges of "about 5 wt. % to about 25 wt. %," etc.). The modifier "about" used in connection with a quantity is inclusive of the stated value and has the meaning dictated by the context (e.g., includes the degree of error associated with measurement of the particular quantity).

The subject matter disclosed herein relates generally to methods for improving inversion layer mobility and providing low defect density in a semiconductor device based upon a silicon carbide (SiC) substrate. Conventional SiC based devices often exhibit poor inversion layer mobility, i.e., poor mobility of electrons from a source region to a drain region. This poor inversion layer mobility is thought to result from traps, also referred to as defects, present at the SiC/SiO interface. These traps, in turn, are thought to possibly result from the presence of atomistic structural defects at or within one or several atomic layers at the SiC-silicon dioxide interface. While the precise nature of one or more such defect types is under intense investigation, it is believed that they are related to the presence of carbon, since the above stated phenomenon are restricted to SiC devices and not in the equivalent silicon devices.

The present methods provide for the formation of gate oxide layers on SiC substrates in a manner that limits the rate of defect generation and/or increases the rate of defect annihilation by high temperature oxidation of the SiC substrate. Surprisingly, it has now been discovered that formation of a gate oxide layer at extremely high temperatures (e.g., at least about 1300° C.) and low oxygen partial pressures, can result in a defect generation rate of nearly zero and/or a high defect annihilation rate, so that the resulting gate oxide may be substantially free from defects. Devices based upon SiC substrates comprising gate oxides formed according to the inventive methods can have inversion mobilities of at least about 12 $cm^2$/Vs, a result that may be counterintuitive to those of ordinary skill in the art since electrically active defects may typically be formed at elevated temperature (e.g., 1100° C.) processing cycles. Long term stability of such devices may also be enhanced.

Accordingly, in the present methods, a gate oxide layer is formed on a SiC substrate by oxidizing the SiC substrate at high temperature. The oxidation can be carried out by any known method, including, e.g., wet or dry oxidation. Generally speaking, in oxidation procedures the growth of an oxide layer involves heating the SiC substrate in a chamber such as a furnace to the desired temperature. Once heated, a gaseous mixture comprising oxygen is introduced into the chamber. Alternatively, the desirable gas or gas mixture may be introduced into a chamber where the SiC substrate resides, and the chamber subsequently heated to the predetermined temperature. In wet oxidation, the chosen gaseous mixture forms pyrogenic steam, which oxidizes the top surface of SiC substrate to form the gate oxide. Wet oxidation can also be performed by bubbling the desired gaseous mixture through hot de-ionized water into the heated furnace, where the gaseous mixture saturated with water vapor would also act to oxidize the top surface of the SiC substrate to form the gate oxide. Dry oxidation may also be used, if desired, and involves the introduction of a gaseous mixture comprising oxygen, or oxygen alone, into the chamber to form the oxide on SiC substrate.

The gaseous mixture utilized may depend on the particular method of oxidation chosen as well the particular parameters of the chosen method. Typically, gaseous combinations of oxygen with inert or noble gases such as nitrogen, hydrogen, argon, etc. or combinations of these are utilized. Although combinations of multiple gases may be utilized, consideration should also be given to process design, and if the use of multiple carrier gases provides no or negligible advantage, preference may be given to the utilization of a single inert carrier gas in the gaseous mixture/combination. In certain embodiments of the invention, combinations of oxygen with argon are advantageously employed.

Similarly, the concentration of each gas within the gaseous mixture will depend upon the gases chosen. Typically the oxygen concentration will drive the oxidation of the substrate, and can be chosen to achieve a desired oxidation rate, with consideration given to the other oxidation process parameters. The remainder of the gaseous mixture will then be comprised of the particular inert carrier gas(es) chosen. Oxidation may be effectively performed with oxygen concentrations as low as 0.1%, and in certain dry oxidation methods may desirably be carried out with up to about 100% oxygen, and thus a suitable range of oxygen concentration for use in the present methods includes this range, as well as all subranges in between.

As mentioned above, it has now been surprisingly discovered that oxidation at extremely high temperatures can result can result in a defect generation rate of nearly zero and/or a high defect annihilation rate, so that the resulting gate oxide may be substantially free from defects. More particularly, it has now been discovered that oxidations carried out at least about 1300° C., 1500° C., 1750° C. or even higher can provide a gate oxide with reduced defects as compared to those provided via conventional methods. Oxidation according to the present methods is thus advantageously carried out at temperatures of from about 1300° C. to about 1800° C., inclusive of all individual temperatures and subranges therebetween.

The oxidation may be carried out for any desired time period, and is typically carried out for a sufficient amount of time to provide gate oxide with a desired thickness. Suitable gate oxide thicknesses can range from about 20 nm to about 200 nm, and such thicknesses typically may be provided, depending of course on the particular oxidation parameters, in from about 1 second to about 10 hours.

While the present methods are expected to provide the SiC devices so treated with improved inversion layer mobilities relative to conventionally oxidized SiC devices, the addition of a passivation agent to the oxidation process may provide further improvements to the same. Thus, the present methods contemplate the addition of a passivation agent to the chamber prior to, during, or after oxidation of the SiC substrate. Any known passivation agent may be utilized, and examples of these include, but are not limited to, nitrogen, hydrogen and combinations of these.

Once oxidation is complete so that an oxide layer with the desired thickness has been formed, the oxidized SiC substrate may be further processed to provide any desired semiconductor device. Prior to the formation of any additional features, the oxidized SiC substrate may desirably be annealed by any known method of doing so known to those of ordinary skill in the art. Generally speaking, the oxidized SiC substrate may be annealed, if the same is desired, by cooling the oxidized SiC substrate to a temperature of about 1400° C., or 1200° C. or even as low as 1000° C. and holding the oxidized SiC substrate at this temperature for as long as desired. Annealing may also assist in relieving any strain in the oxidized SiC substrate, and if the same is desired, time periods of at least 10 minutes and up to about 10 hours, inclusive of all subranges therebetween, are generally sufficient to provide the desired strain relief.

The SiC substrate may be processed to provide any desired semiconductor device. For example, to provide an N-type MOSFET, source, drain, and p-well regions may be doped by ion implantation, diffusion or epitaxy. Next, the doped regions may optionally be activated by annealing at high temperature. Then, the sample is oxidized as described above. A polysilicon layer may be deposited, and subsequently patterned and/or etched to provide a polysilicon gate electrode, which may preferably be doped, for example p+ doped. Ohmic contacts can then be formed over the source and drain regions and the upper portion of the polysilicon gate electrode, and are then annealed to provide the completed N-type MOSFET.

In FIG. 1, a flow chart schematically illustrating the present method 100, shows the formation of an oxide on the Si-face of a SiC-substrate in a first step 101. Advantageously, the oxidation is carried out at a high temperature, i.e., at least about 1300° C. and up to at least about 1800° C. and inclusive of all subranges inbetween. Oxidation step 101 may be carried out with any desired concentration of oxygen containing gas, and if desired, may be carried out with low concentrations of oxygen. Suitable ranges of oxygen concentration are thus expected to be from about 0.1% to about 100% oxygen, in any desired, suitable carrier gas. Oxidation under these conditions is expected to provide an inversion layer mobility in a completed semiconductor device prepared according to the method of at least about 12 $cm^2$/Vs. In certain embodiments of the present method, the oxidized SiC substrate may be subsequently annealed in a suitable atmosphere, e.g., an atmosphere comprising hydrogen or nitrogen, in step 102.

Figure 2:
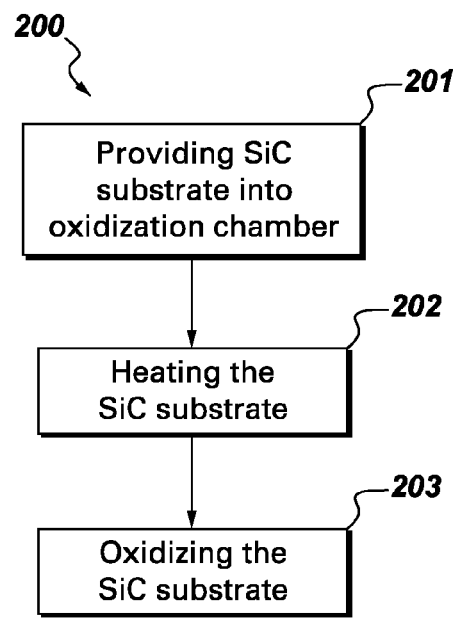
FIG. 2 is a flow-chart schematically illustrating an additional embodiment of the present method.

FIG. 2 is a flowchart illustration of an additional embodiment 200 of the present method, wherein in first step 201, a SiC-substrate is provided in an oxidation chamber. The oxidation chamber is desirably heated to a temperature of at least about 1300° C. and up to about 1800° C., or any temperature therebetween at step 202. Oxidation of the SiC-substrate is then conducted at step 203, with an oxidation agent is introduced into the chamber at a concentration and for an amount of time to provide an oxide layer of the desired thickness, typically from about 20 nm to about 200 nm. Either wet or dry oxidation may be used at step 203.

Figure 3:
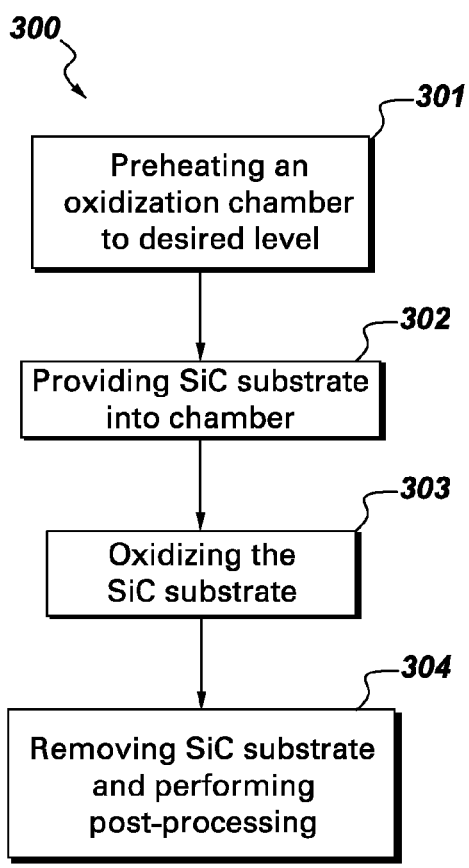
FIG. 3 is a flow-chart schematically illustrating a further embodiment of the present method.

FIG. 3 is a schematic illustration of yet another embodiment 300, wherein at a first step 301, an oxidation chamber is heated to a temperature of at least about 1300° C. to about 1800° C., or any desired temperature therebetween. A Si—C substrate is then provided in the oxidation chamber at step 302, and at step 303, oxidation of the SiC substrate is carried out according to any desired oxidation protocol, using any desired oxidation agent. Advantageously, oxidation according the present method may be carried out at low concentrations of oxygen, e.g., about 0.1%. After the oxidation processing is completed, the SiC substrate is removed and subject to post-processing 304.

Figure 4:
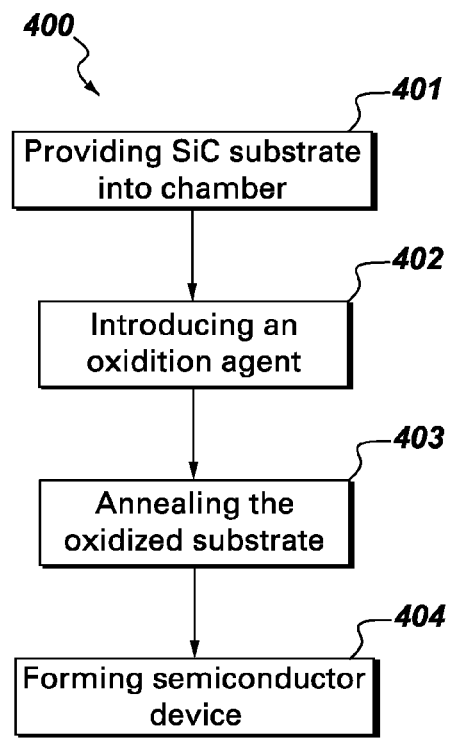
FIG. 4 is a flow-chart schematically illustrating yet another embodiment of the present method.

A further embodiment of the present method is schematically illustrated in FIG. 4, wherein at step 401, a SiC substrate is provided in an oxidation chamber. The chamber is either preheated, or may be heated once the SiC substrate is placed therein. Desirably, during oxidation, the chamber will be at a temperature of at least about 1300° C. to about 1800° C., or any temperature, or range of temperatures, therebetween. That is, the temperature may fluctuate during oxidation either due to normal operating variances, or can be made to vary within this range if desired. At step 402, an oxidation agent is introduced into the chamber and oxidation of the SiC substrate is caused to occur. The oxidation agent may be any suitable, desired agent, and advantageously may comprise a low concentration of oxygen, e.g., the oxidation agent may comprise as little as about 0.1% oxygen. Once oxidation step 402 has provided substrate SiC with an oxide layer of the desired thickness, the substrate may be annealed at step 403 in an environment suitable for the same. At step 404, the substrate is further processed to provide a complete semiconductor device, e.g., the oxidized SiC substrate may have gate, source and drain contacts provided thereon, and optionally a passivation layer, to provide a SiC MOSFET.

Figure 5:
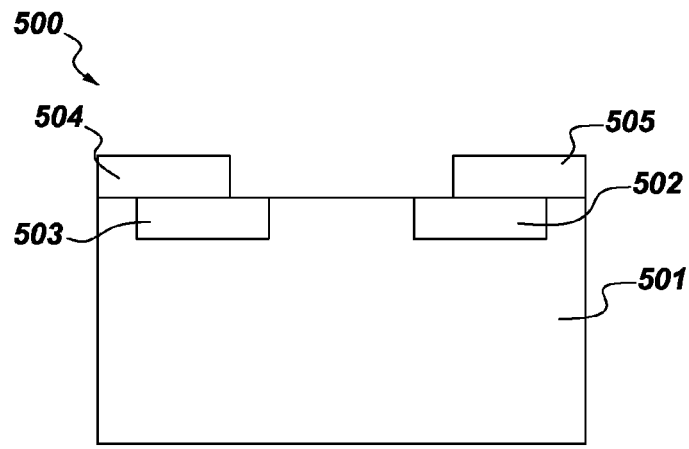
FIG. 5 is a cross sectional view of an in-process semiconductor device.

Turning now to FIG. 5, there is shown an in-process semiconductor device. Semiconductor device 500 may generally comprise a SiC p-type doped substrate 501, source contact 504, drain contact 505, N+ doped source region 503, and N-doped drain region 502. As shown, source contact 504 and drain contact 505 are in electrical contact with source region 503 and drain region 502, respectively. Regions 503 and 502, and contacts 504 and 505 are not critical and may comprise any known material and be formed by any known method. Additionally, contacts 504 and 505 may be formed on device 500 post-oxidation, if desired. For example, contacts 504 and 505 could be deposited metal, e.g., aluminum.

Figure 6:
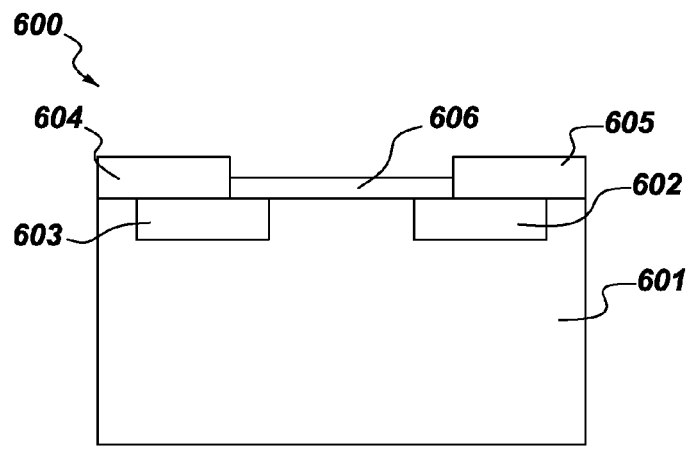
FIG. 6 is a cross sectional view of the device of FIG. 5, once subjected oxidation according to one embodiment of the present method.

Referring now to FIG. 6, oxide layer 606 is provided by oxidizing semiconductor device 600 at high temperature, e.g., from about 1300° C. to about 1800° C. inclusive of all temperatures and ranges therebetween, and at an oxygen concentration of from as low as about 0.1% and up to about 100%.

Figure 7:
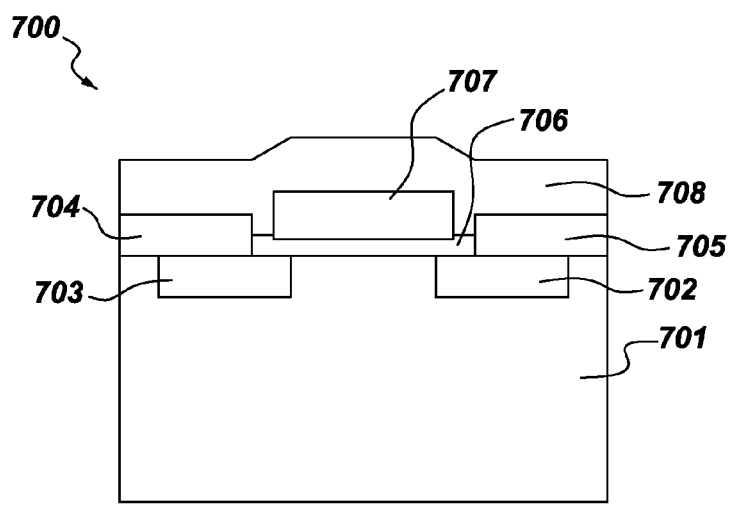
FIG. 7 is a cross sectional view of a completed SiC MOSFET based upon the device shown in FIGS. 5 and 6.

FIG. 7 shows a completed semiconductor device 700, more specifically a SiC MOSFET. Once oxidation has been carried out according to the present methods to provide oxide layer 706 on device 700, device 700 is desirably further processed to provide additional features, such as gate contact 707, and if desired, passivation layer 708. By application of the present method, device 700 is expected to exhibit inversion layer mobilities, i.e., mobility of electrons from source region 703 to drain region 702, of at least about 12 $cm^2/Vs$.

Figure 8:
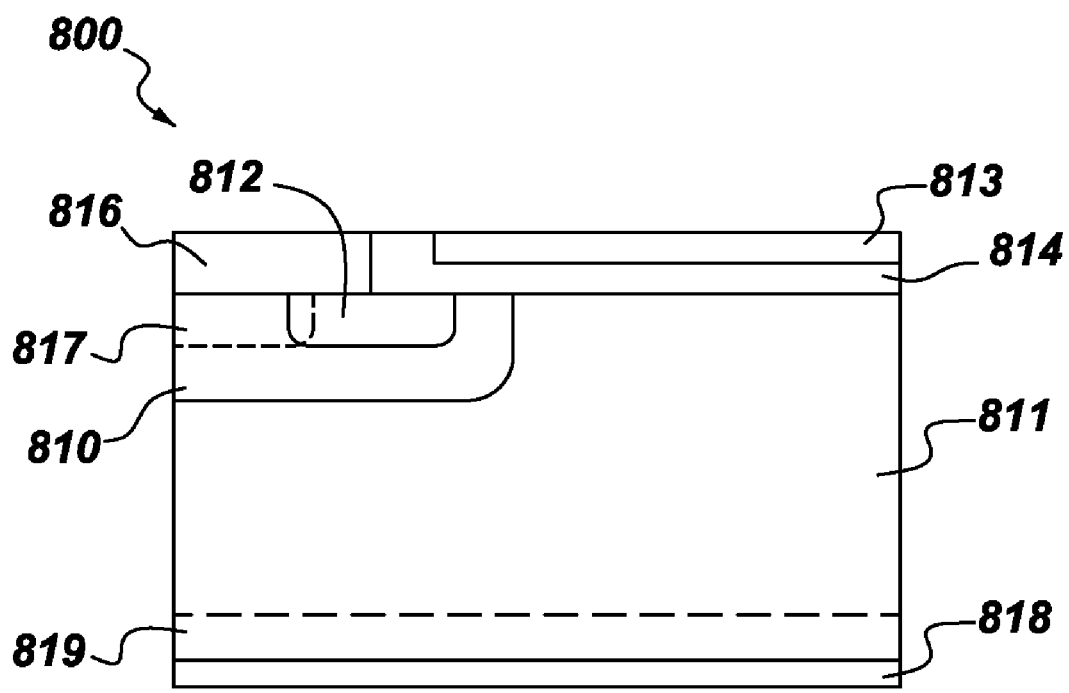
FIG. 8 is a cross sectional view of an additional semiconductor device advantageously processed according to embodiments of the present invention.

An alternative embodiment of the present device is shown in FIG. 8. More particularly, FIG. 8 shows a partial cross sectional view of an N-type, SiC vertical MOSFET cell 800. In an actual power MOSFET device, several of such cells 800 would be connected in parallel.

As is shown in FIG. 8, the vertical MOSFET cell 800 includes a P-well region 810 formed within a top surface of an N− drift layer 811, and an N+ source region 812 formed within the P-well region 810. Gate insulating film 814 is provided by oxidizing semiconductor device 800 at high temperature, e.g., from about 1300° C. to about 1800° C. inclusive of all temperatures and ranges therebetween, and at an oxygen concentration of from as low as about 0.1% and up to about 100%.

Thereafter, gate electrode 813 is formed on a gate insulating film 814, and over a portion of the P-well region 810 interposed between the N+ source region 812 and an exposed surface portion of the N− drift layer 811. In addition, a source electrode 816 is formed in contact with the surface of both the N+ source region 812 and the P-well region 810. As shown, a more highly doped P+ region 817, located at the top of the P-well region 810, enhances ohmic contact between the source electrode 816 and the P-well region 810. MOSFET 800 further includes a drain electrode 818 formed in contact with the rear surface of an N+ drain region 819.

In operation of the vertical MOSFET 800, a positive voltage applied to the gate electrode 813 induces an inversion layer in the surface of the P-well 810 directly beneath the gate insulating film 814, such that current flows between the source electrode 816 and drain electrode 818 (and through the N− drift layer 811). If the positive voltage to the gate electrode 813 is removed, the inversion layer beneath the gate insulating film 814 in the P-well 810 disappears and a depletion layer spreads out, thereby blocking current flow through the P-well 810.

As indicated above, the P-well region 810 is typically formed through implantation of the N− drift layer 811 by a suitable P-type dopant (e.g., boron, aluminum). Subsequently, the N+ source region 812 and the more highly doped P+ region 817 are also formed within the P-well region 810 through similar dopant implantation steps. By application of the present method, device 800 is expected to exhibit inversion layer mobilities, i.e., mobility of electrons from source region 812 to drain region 819, of at least about 12 $cm^2/Vs$.

While only certain features of the invention have been illustrated and described herein, many modifications and changes will occur to those skilled in the art. It is, therefore, to be understood that the appended claims are intended to cover all such modifications and changes as fall within the true spirit of the invention.

EXAMPLE 1

A piece of 3" diameter 0001-silicon face silicon carbide wafer with implanted and activated source, drain and body regions, was diced into four quarters. One quarter-wafer was tested for high temperature formation of gate oxide.

More specifically, the one quarter wafer was placed inside a fused silica cup, approximately 70 mm diameter and 150 mm tall. The cup was provided with a fused silica cover and the cup was welded to a lid to form an enclosed fused silica ampoule. A pipe attached to the top of the lid was connected to a vacuum manifold, and the temperature within the ampoule raised to about at 300° C. and the ampoule evacuated to less than 1.E-5 Torr and then back-filled with 20% oxygen and 80% argon.

In order to accommodate gas expansion during high temperature oxidation, the initial back-fill pressure at room temperature was a fraction of an atmospheric pressure. In this test, the total pressure inside the ampoule at room temperature was 135 mm of mercury pressure. The pipe on the ampoule was subsequently welded shut.

The sealed ampoule was placed inside a furnace that was constructed with refractory metal and was capable of rapid excursion to high temperatures in argon at ambient pressure. It was heated to 1730° C. in 10 minutes, held at 1730° C. for 5 minutes and cooled to 670° C. in 5 minutes. The oxidation test was terminated by turning off the power and the furnace allowed to cool to room temperature.

To extract the silicon wafer from the ampoule, it was placed in a vacuum chamber and cracked open mechanically with a punch. The purpose of the vacuum chamber was to prevent ampoule implosion from damaging the silicon carbide wafer. The thickness of the thermal oxide was 215 nm. After subsequent device processing steps, including putting down field oxide and electrodes, mobility was measured to be 12 $cm^2$/V-sec.

Further gate oxide oxidation tests were carried out, the conditions and results of which, in addition to those of Example 1 are shown below in Table I.

TABLE I

| Temp (° C.) | Time (sec) | % oxygen | Oxide layer thickness (nm) |
|---|---|---|---|
| 1730 | 300 | 20 | 215 |
| 1730 | 30 | 20 | 175 |
| 1730 | 10 | 25 | 102 |
| 1630 | 10 | 20 | 98 |
| 1580 | 10 | 25 | 52 |
| 1400 | 120 | 5 | 6 |

The invention claimed is:

1. A method for the formation of a gate oxide on a silicon carbide substrate comprising oxidizing the substrate with a gaseous mixture of argon and oxygen at a temperature of at least about 1300° C.

2. The method of claim 1, wherein the temperature is at least about 1500° C.

3. The method of claim 2, wherein the temperature is at least about 1700° C.

4. The method of claim 1, wherein the substrate is oxidized for at least about 1 second.

5. The method of claim 1, wherein a semiconductor device based upon the substrate is provided with an inversion layer mobility of at least about 12 cm2/Vs.

6. The method of claim 1, wherein the gaseous mixture comprises at least about 0.1% oxygen.

7. The method of claim 1, wherein the gaseous mixture comprises from about 1% to about 100% oxygen.

8. The method of claim 1, further comprising subjecting the oxidized substrate to a strain relief heat treatment.

9. The method of claim 1, further comprising exposing the substrate to a passivation agent.

10. The method of claim 9, wherein the substrate is exposed to the passivation agent prior to heating the substrate.

11. The method of claim 9, wherein the substrate is exposed to the passivation agent during heating.

12. The method of claim 9, wherein the substrate is exposed to the passivation agent after heating the substrate.

13. The method of claim 9, wherein the passivation agent comprises nitrogen, hydrogen or combinations of these.

14. A semiconductor device based upon a silicon carbide substrate comprising a gate oxide formed in connection therewith by oxidizing the substrate with a gaseous mixture of argon and oxygen at a temperature of at least about 1300° C.

15. The device of claim 14, having an inversion layer mobility of at least about 12 cm2/Vs.

16. The method of claim 1, wherein the gaseous mixture of argon and oxygen comprises about 80% argon and about 20% oxygen.

17. The method of claim 1, wherein the temperature is about 1730° C.

18. A method for the formation of a gate oxide on a silicon carbide substrate comprising oxidizing the substrate with a gaseous mixture of about 80% argon and 20% oxygen at a temperature of about 1730° C.

19. The method of claim 1, further comprising annealing the oxidized substrate at a temperature of at least about 1000° C.

20. The method of claim 19, wherein the annealing is in an atmosphere comprising nitrogen.

* * * * *